United States Patent
Liu et al.

(10) Patent No.: US 7,242,617 B2
(45) Date of Patent: Jul. 10, 2007

(54) METHOD OF DYNAMICALLY ADJUSTING OPERATION OF A MEMORY CHIP AND APPARATUS OF MEASURING THICKNESS OF AN ONO LAYER OF THE MEMORY CHIP

(75) Inventors: Cheng-Jye Liu, Jhongli (TW); Tai-Liang Hsiung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 96 days.

(21) Appl. No.: 11/188,202

(22) Filed: Jul. 22, 2005

(65) Prior Publication Data

US 2007/0030720 A1 Feb. 8, 2007

(51) Int. Cl.
*G11C 16/04* (2006.01)

(52) U.S. Cl. ............................ 365/185.18; 365/185.28; 365/185.29

(58) Field of Classification Search ............ 365/185.18, 365/185.28, 185.29
See application file for complete search history.

(56) References Cited

U.S. PATENT DOCUMENTS 6,750,157 B1 * 6/2004 Fastow et al. .............. 438/786
2006/0017092 A1 * 1/2006 Dong et al. ................. 257/314

* cited by examiner

*Primary Examiner*—Hoai V. Ho
(74) *Attorney, Agent, or Firm*—J. C. Patents

(57) ABSTRACT

A method for dynamically adjusting the operation of a memory chip is disclosed. First, a memory chip is provided. The memory chip comprises an ONO layer. Then, the thickness of the ONO layer in the memory chip is measured, and a read word line voltage of the memory chip is then adjusted based on the measured thickness of the ONO layer. Since the operation window of memory chip is dynamically adjusted, a more reliable product operation and a sufficient mass production window are obtained.

9 Claims, 4 Drawing Sheets

METHOD OF DYNAMICALLY ADJUSTING OPERATION OF A MEMORY CHIP AND APPARATUS OF MEASURING THICKNESS OF AN ONO LAYER OF THE MEMORY CHIP

BACKGROUND OF THE INVENTION

1. Field of the Invention

The present invention relates to a method for operating a memory chip, and more particularly, to a method for dynamically adjusting the operation of a memory chip and an apparatus for measuring the thickness of an oxide-nitride-oxide (ONO) layer in the memory chip.

2. Description of the Related Art

Generally speaking, the operation window of the typical flash memory has two states: one is a program state, and the other one is an erase state. In order to increase the reliability of the memory, preferably, the program state should be separated from the erase state as much as possible such that a medium voltage can be defined to read these two states. However, as shown in FIG. 1, after many times of read-write operation, the operation window of the memory may be changed.

FIG. 1 schematically shows a relationship diagram of cycling times and threshold voltage (i.e. Vt), and a thickness of the tested ONO layer is about 200 Å. Referring to FIG. 1, wherein ▲ line represents a threshold voltage of a device after writing, ○ line represents a threshold voltage of the device after losing the storage charge during writing state, ■ line represents a threshold voltage of the device after erasing, and ▬ line represents a change of a threshold voltage after keeping the device in erasing state for a long time. After cycling operated (with a current of 10 µA) for a certain period of time, as the operating times increase, more charge loss (i.e. GL in the diagram) and more charge gain (i.e. CG in the diagram) are occurred. As a result, the window between the program voltage (i.e. PV in the diagram) and the erase voltage (i.e. EV in the diagram) is reduced, and problems may be occurred in the read word line voltage (i.e. RDWL in the diagram) between PV and EV after the cycling times exceed 10K.

In the prior art, RDWL was not adjusted after the product was manufactured. However, since there are some variances in the fabricating process, some methods for adjusting the size of RDWL based on the cycling times in the product operation have been disclosed in the field recently. Nevertheless, such methods only use a single memory cell (a single bit is used as a baseline) for measurement; if some unexpected problem is happened in the memory cell which is used as the baseline, the whole adjustment will be inaccurate.

SUMMARY OF THE INVENTION

Therefore, it is an object of the present invention to provide a method for dynamically adjusting the operation of a memory chip so as to obtain a more reliable product operation.

In is another object of the present invention to provide an apparatus for measuring the thickness of an ONO layer in the memory chip, and the apparatus can easily measure the thickness of the ONO layer.

In is yet another object of the present invention to provide a method for dynamically adjusting the operation of a memory chip so as to obtain a sufficient mass production window.

The present invention provides a method for dynamically adjusting the operation of a memory chip. First, a memory chip is provided, and the memory chip comprises an ONO layer. Then, the thickness of the ONO layer in the memory chip is measured, and then a read word line voltage of the memory chip is adjusted based on the measured thickness of the ONO layer.

In the method for dynamically adjusting the operation of a memory chip according to an embodiment of the present invention, the memory chip mentioned above includes a standard program voltage, a standard erase voltage and a standard read word line voltage. Wherein, the standard read word line voltage is between the standard program voltage and the standard erase voltage. In addition, when the thickness of the ONO layer is higher, the read word line voltage of the memory chip is adjusted to be higher than the standard read word line voltage. Otherwise, when the thickness of the ONO layer is lower, the read word line voltage of the memory chip is adjusted to be lower than the standard read word line voltage.

In the method for dynamically adjusting the operation of a memory chip according to another embodiment of the present invention, the memory chip mentioned above includes a standard program voltage and a standard erase voltage. A program margin (PM) and an erase margin (EM) are contained between the standard program voltage and the standard erase voltage, and the value of the program margin is equal to the value of the erase margin. In addition, when the thickness of the ONO layer is higher, the program margin is reduced and/or the erase margin is increased. Otherwise, when the thickness of the ONO layer is lower, the program margin is increased and/or the erase margin is reduced.

In the method for dynamically adjusting the operation of a memory chip according to the preferred embodiment of the present invention, the method for measuring the thickness of the ONO layer in the memory chip mentioned above comprises using a sense amplifier to electrically measure the thickness of the ONO layer.

In the method for dynamically adjusting the operation of a memory chip according to the preferred embodiment of the present invention, the thickness of the ONO layer in the memory chip is measured when the wafer sort (WS) is being processed.

In the method for dynamically adjusting the operation of a memory chip according to the preferred embodiment of the present invention, the thickness of the ONO layer in the memory chip is measured when the final test (FT) is being processed.

In the method for dynamically adjusting the operation of a memory chip according to the preferred embodiment of the present invention, the memory chip mentioned above comprises a flash memory chip.

The present invention further provides an apparatus for measuring the thickness of an ONO layer in the memory chip so as to provide a baseline for dynamically adjusting the operation of a memory chip, and the memory chip comprises a first ONO layer. The apparatus at least comprises an ONO capacitor and a sense amplifier circuit. Wherein, the ONO capacitor has a second ONO layer, and the second ONO layer has the same structure as the first ONO layer. The sense amplifier circuitry is electrically coupled to the ONO capacitor, such that a thickness range of the second ONO layer is electrically measured. The thickness range is used as a baseline for dynamically adjusting the operation of the memory chip.

In the apparatus for measuring the thickness of an ONO layer in the memory chip according to the preferred embodiment of the present invention, the sense amplifier circuitry mentioned above comprises a sense amplifier, a reference voltage input, an ONO capacitor, a time controlled switch and a current source. The sense amplifier comprises a first input terminal, a second input terminal and an output terminal. The reference voltage input is electrically coupled to the first input terminal of the sense amplifier, and the ONO capacitor is electrically coupled to the second input terminal of the sense amplifier via a node. In addition, the time controlled switch is electrically coupled to the second input terminal of the sense amplifier via the node. One end of the current source is electrically coupled to the time controlled switch, and the other end of the current source is grounded. Further, when an input voltage from the reference voltage input is less than the node, the output terminal displays a sign of "failed". On the contrary, when the input voltage from the reference voltage input is larger than the node, the output terminal displays a sign of "pass".

In the apparatus for measuring the thickness of an ONO layer in the memory chip according to the preferred embodiment of the present invention, the ONO capacitor mentioned above comprises a top electrode, a bottom electrode disposed below the top electrode and a second ONO layer disposed between the top electrode and the bottom electrode.

The present invention further provides a method for dynamically adjusting the operation of a memory chip, the method is suitable for adjusting a program margin and an erase margin of a memory chip having an ONO layer. The method comprises the following steps. First, a full thickness of the ONO layer is divided into a plurality of thickness levels, and each thickness level corresponds to a set of the program margin and the erase margin. Then, a plurality of test orders is configured based on the thickness levels, wherein each test order has a switch timer for controlling a switch timing of the time controlled switch in the apparatus described in the previous embodiment. Each test order is sequentially examined by the apparatus mentioned above. When the output terminal of the sense amplifier displays a sign of "pass", the thickness level corresponding to the test order displaying a sign of "pass" is determined as the thickness of the ONO layer. Afterwards, the program margin and the erase margin of the memory chip are adjusted, such that the adjusted program margin and the adjusted erase margin are corresponded to the set of the program margin and the erase margin corresponding to the thickness level of the test order displaying a sign of "pass".

Since the operation of the memory chip is dynamically adjusted based on the thickness of the ONO layer in the present invention, the problem of the operation window shrinkage caused by too many cycling operations can be ignored. Accordingly, a more reliable product operation and a sufficient mass production window are obtained. In addition, the apparatus for measuring the thickness of the ONO layer in the memory chip provided by the present invention can easily measure the thickness of the ONO layer, which also facilitates dynamically adjusting the operation of the memory chip.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

The main concept of the present invention is to dynamically adjust a read word line voltage of the memory chip based on the thickness of the ONO layer. Table 1 illustrates various impacts of the thickness of the ONO layer onto the charge loss (i.e. GL in table 1) and the charge gain (i.e. CG in table 1).

TABLE 1

|  |  | THICK | THIN |
|---|---|---|---|
| BOX | CL | Low | High |
|  | CG | High | Low |
| TOX | CL | Low | High |
|  | CG | High | Low |
| ONO | CL | Low | High |
|  | CG | High | Low |

Figure 1:
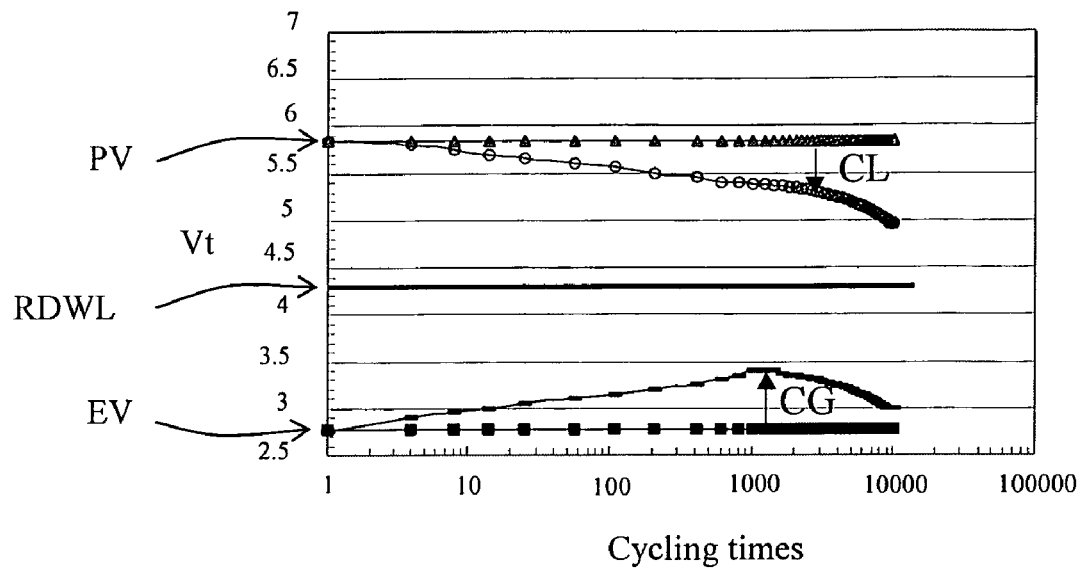
FIG. 1 schematically shows a relationship diagram of cycling times and threshold voltage of a typical flash memory.
Figure 2:
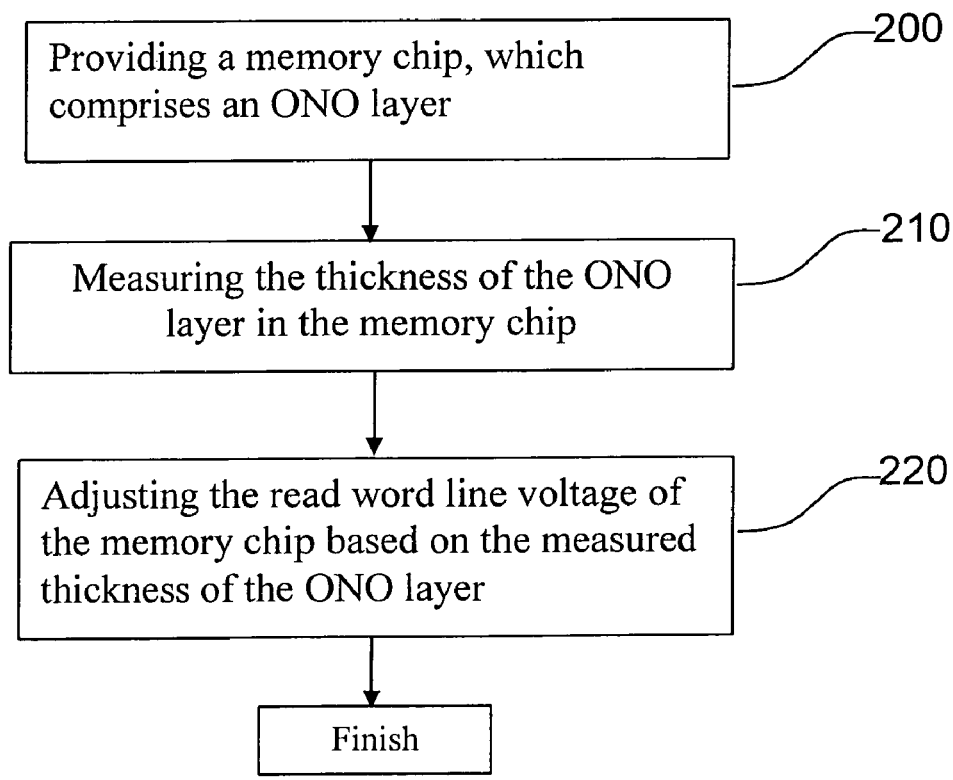
FIG. 2 schematically shows a flow chart illustrating a method for dynamically adjusting the operation of the memory chip according to a first embodiment of the present invention.

FIG. 2 schematically shows a flow chart illustrating a method for dynamically adjusting the operation of the memory chip according to a first embodiment of the present invention. Referring to FIG. 2, in step 200, a memory chip is provided. The memory chip comprises an ONO layer and the memory chip is a flash memory chip or other memory having an ONO layer. In addition, the memory chip includes a standard program voltage (PV), a standard erase voltage (EV) and a standard read word line voltage (RDWL). The standard RDWL voltage is between the standard program voltage and the standard erase voltage. The so-called "standard program voltage" is a threshold voltage of the memory after writing data, and the so-called "standard erase voltage" is a threshold voltage of the memory after erasing data.

Then, in step 210, the thickness of the ONO layer in the memory chip is measured. Generally speaking, the thickness of the ONO layer can be measured by using an optic measurement method. However, in order to ensure the physical electricity behavior of the ONO layer and the correlation among its thicknesses, it is preferable to use an electricity measurement in the present embodiment. For example, a sense amplifier is used to electrically measure the thickness of the ONO layer. In addition, the measuring operation in step 210 can be performed when the wafer sort (WS) is being processed. Alternatively, the measuring operation in step 210 can be performed when the final test (FT) is being processed. Wherein, the wafer sort is for example using a probe to perform a pass/failure test on the die when the chip is still being fabricated, and part of the die can be repaired by a laser beam. The final test is performed after the IC is packed so as to ensure the function and specification of the IC finished products are totally met the requirement.

Then, in step 220, the read word line voltage of the memory chip is adjusted based on the thickness of the ONO layer. In addition, the adjusting method mentioned above may be referred to FIG. 3 which schematically shows the relationship of the voltages of each operation state of a memory chip when its ONO layer is in the standard state and when the ONO layer is thicker or thinner.

Figure 3:
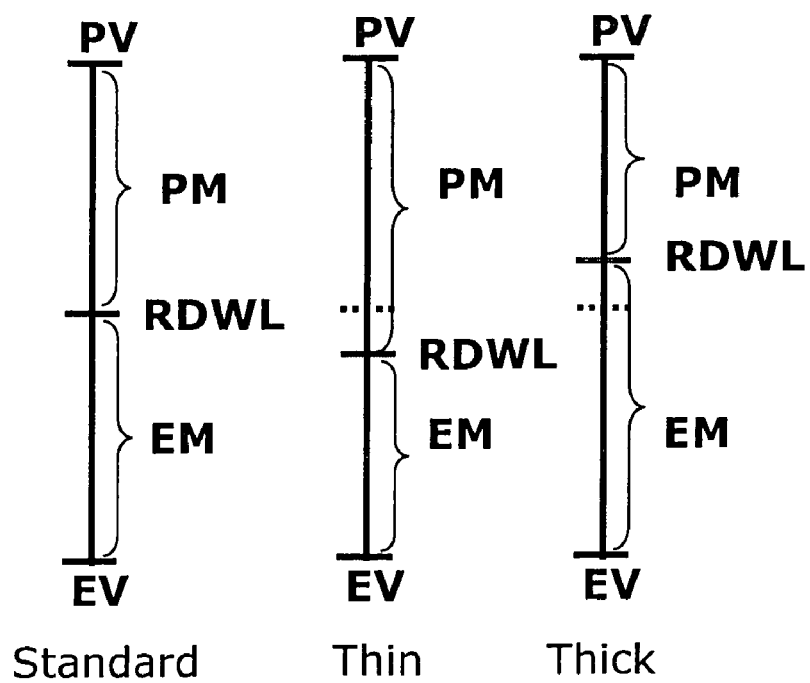
FIG. 3 schematically shows a diagram illustrating the voltages of each operation state of a memory chip when its ONO layer is in standard state and when the ONO layer is thicker and thinner.

In one example, referring to the diagram marked as "thick" in the rightmost of FIG. 3, when the thickness of the ONO layer is higher, the read word line voltage of the memory chip (i.e. RDWL in FIG. 3) should be adjusted to be higher than the standard read word line voltage (i.e. the diagram marked as "standard" in the leftmost of FIG. 3). Otherwise, when the thickness of the ONO layer is lower (i.e. the diagram marked as "thin" at the center of FIG. 3), the read word line voltage of the memory chip should be adjusted to be lower than the standard read word line voltage.

On the other hand, another example is further inferred from FIG. 3. Referring to FIG. 3, a program margin (i.e. PM in FIG. 3) and an erase margin (i.e. EM in FIG. 3) are contained between the standard program voltage (PV) and the standard erase voltage (EV). In addition, when the thickness of the ONO layer is higher (i.e. the diagram marked as "thick" in the rightmost of FIG. 3), it is optional to reduce the program margin (PM) and/or increase the erase margin (EM). Otherwise, when the thickness of the ONO layer is lower (i.e. the diagram marked as "thin" at the center of FIG. 3), it is optional to increase the program margin (PM) and/or reduce the erase margin (EM).

Figure 4:
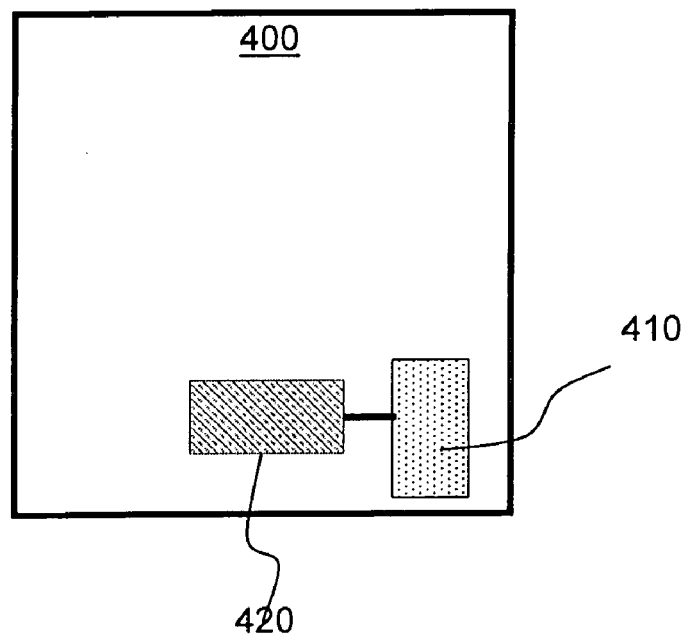
FIG. 4 schematically shows an apparatus for measuring the thickness of the ONO layer in the memory chip according to a second embodiment of the present invention.
Figure 5:
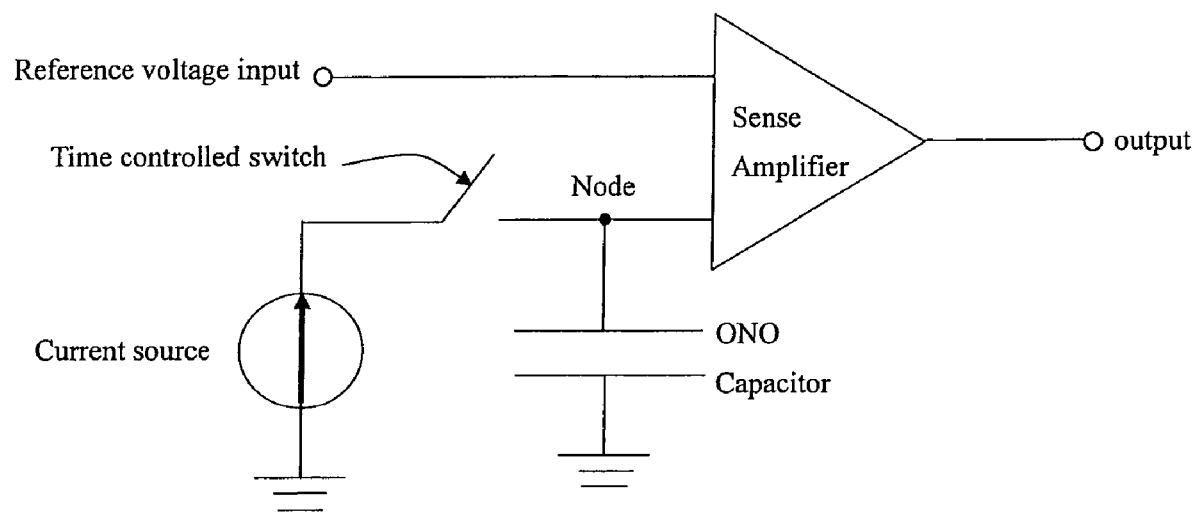
FIG. 5 schematically shows a circuit diagram of the sense amplifier circuitry of FIG. 4.

FIG. 4 schematically shows an apparatus for measuring the thickness of the ONO layer in the memory chip according to a second embodiment of the present invention. FIG. 5 schematically shows a circuit diagram of the sense amplifier circuitry of FIG. 4.

Referring to FIG. 4, the apparatus of the present embodiment provides a baseline of dynamically adjusting the operation of a memory chip 400. The memory chip 400 comprises an ONO layer. For example, the ONO layer is an inter-gate dielectric layer in the memory chip of a flash memory. The apparatus at least comprises an ONO capacitor 410 and a sense amplifier circuitry 420. Wherein, the so-called "ONO capacitor 410" is a capacitor of the ONO layer having the same structure as the ONO layer in the memory chip 400. In addition, the sense amplifier circuitry 420 is electrically coupled to the ONO capacitor 410, such that the thickness range of the ONO layer in the ONO capacitor 410 is electrically measured. The thickness range is used as a baseline for dynamically adjusting the operation of the memory chip 400.

Then, referring to FIG. 5, the sense amplifier circuitry of FIG. 4 comprises a sense amplifier, a reference voltage input, an ONO capacitor, a time controlled switch, and a current source. The sense amplifier comprises two input terminals and one output terminal. The reference voltage input is electrically coupled to the first input terminal of the sense amplifier, and the ONO capacitor is electrically coupled to the second input terminal of the sense amplifier via a node. In addition, the time controlled switch is electrically coupled to the second input terminal of the sense amplifier via the same node. One end of the current source is electrically coupled to the time controlled switch, and the other end of the current source is grounded. And, when an input voltage from the reference voltage input is less than the node, the output terminal displays a sign of "failed". On the contrary, when the input voltage from the reference voltage input is larger than the node, the output terminal displays a sign of "pass". Furthermore, the ONO capacitor mentioned above comprises a top electrode, a bottom electrode disposed below the top electrode. And, a second ONO layer disposed between the top electrode and the bottom electrode. The second ONO layer has the same structure as the ONO layer in the memory chip 400 (referring to FIG. 4).

Figure 6:
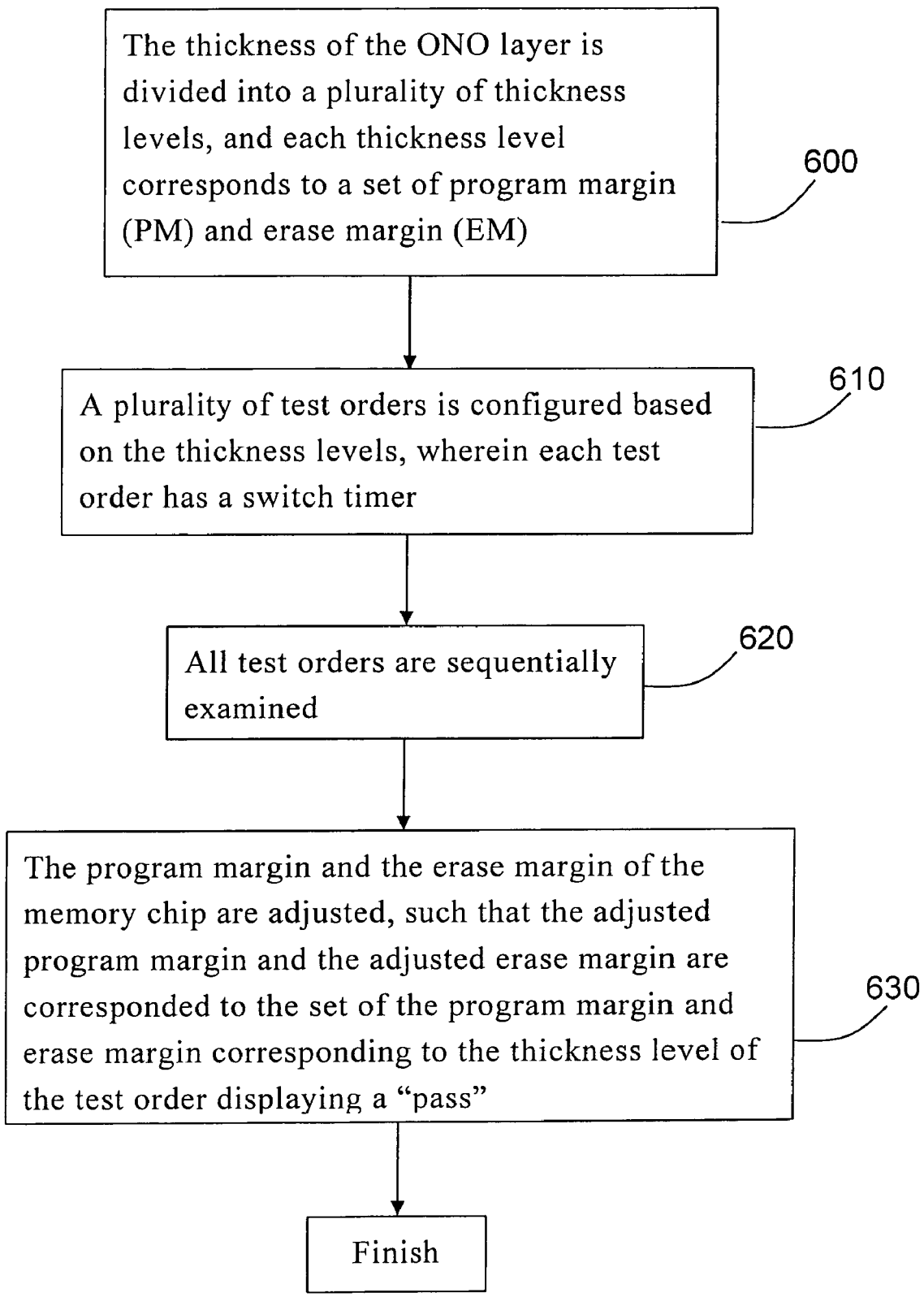
FIG. 6 schematically shows a flow chart illustrating a method for dynamically adjusting the operation of the memory chip according to a third embodiment of the present invention.

Please refer to FIG. 6 for using the apparatus shown in FIGS. 4 and 5 to dynamically adjust the operation of a memory chip.

FIG. 6 schematically shows a flow chart illustrating a method for dynamically adjusting the operation of the memory chip according to a third embodiment of the present invention. First, in step 600, the thickness of the ONO layer is divided into a plurality of thickness levels. For example, four thickness levels E, F, G, H are listed in table 2 below, wherein the thickness level E is about 70 Å, the thickness level F is about 67 Å, the thickness level G is about 64 Å, and the thickness level H is about 61 Å. In addition, each thickness level corresponds to a set of the program margin (PM) and erase margin (EM).

TABLE 2

| Test Order | Switch Timer | Output | ONO Thickness | EM (mV) | PM (mV) |
|---|---|---|---|---|---|
| 1 | A | Pass | E | 500 | 1400 |
| 2 | B | Pass | F | 600 | 1300 |
| 3 | C | Pass | G | 700 | 1200 |
| 4 | C | Pass | H | 800 | 1100 |

Then, in step 610, a plurality of test orders is configured based on the thickness levels, wherein each test order has a switch timer such as A, B, C, D listed in table 2 for controlling a switch timing of the time controlled switch in the apparatus described in the previous embodiment (FIGS. 4 and 5).

Then, in step 620, each test order is sequentially examined by the apparatus of FIGS. 4 and 5. When a reference input voltage is less than the node in FIG. 5, the output terminal displays a sign of "failed". On the contrary, when the reference input voltage is larger than the node in FIG. 5, the output terminal displays a sign of "pass". That is, when the output terminal of the sense amplifier displays the sign of "pass", the thickness level corresponding to the test order displaying the sign of "pass" is determined as the thickness of the ONO layer. For example, when the test order 1 in table 2 is being examined, if the output terminal of the sense amplifier displays the sign of "pass", the thickness level E corresponding to the test order 1 is determined as the thickness of the ONO layer. Furthermore, when the output terminal of the sense amplifier displays the sign of "failed" in the examination of the test order 1 and the test order 2 will subsequently be examined; if the output terminal of the sense amplifier displays the sign of "pass", the thickness level F corresponding to the test order 2 is determined as the thickness of the ONO layer being tested and so on.

Then, in step 630, the program margin and the erase margin of the memory chip are adjusted, such that the adjusted program margin and the adjusted erase margin are corresponded to the set of the program margin and the erase margin corresponding to the thickness level of the test order displaying a sign of "pass". In other words, when the test order 1 in table 2 is examined and a sign of "pass" is displayed, the program margin and the erase margin of the memory chip should be adjusted, such that the adjusted program margin (PM) is 1400 mV and the adjusted erase margin (EM) is 500 mV, which are corresponded to the thickness level E. In short, the program margin and the erase margin of the memory chip are adjusted based on different thickness levels.

In summary, the present invention is characterized in that the operation of the memory chip is dynamically adjusted based on the thickness of the ONO layer, thus the problem of the operation window shrinkage resulted from too many cycling operations can be ignored in the present invention. A more reliable product operation and a sufficient mass production window are obtained.

Furthermore, the apparatus for measuring the thickness of the ONO layer in the memory chip provided by the present invention can easily measure the thickness of the ONO layer, which also facilitates dynamically adjusting the operation of the memory chip.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method for dynamically adjusting an operation of a memory chip, comprising:
   providing a memory chip, and the memory chip comprising an ONO layer;
   measuring a thickness of the ONO layer in the memory chip; and
   adjusting a read word line voltage of the memory chip based on the measured thickness of the ONO layer.

2. The method for dynamically adjusting the operation of the memory chip of claim 1, wherein the memory chip includes a standard program voltage, a standard erase voltage, and a standard read word line voltage, and the standard read word line voltage is between the standard program voltage and the standard erase voltage.

3. The method for dynamically adjusting the operation of the memory chip of claim 2, wherein the step of adjusting the read word line voltage of the memory chip based on the measured thickness of the ONO layer comprises:
   adjusting the read word line voltage of the memory chip to be higher than the standard read word line voltage when the thickness of the ONO layer is higher; and
   adjusting the read word line voltage of the memory chip to be lower than the standard read word line voltage when the thickness of the ONO layer is lower.

4. The method for dynamically adjusting the operation of the memory chip of claim 1, wherein the memory chip includes a standard program voltage and a standard erase voltage, and a program margin and an erase margin are contained between the standard program voltage and the standard erase voltage.

5. The method for dynamically adjusting the operation of the memory chip of claim 4, wherein the steps of adjusting the read word line voltage of the memory chip based on the thickness of the ONO layer comprise:
   reducing the program margin and/or increasing the erase margin when the thickness of the ONO layer is higher; and
   increasing the program margin and/or reducing the erase margin when the thickness of the ONO layer is lower.

6. The method for dynamically adjusting the operation of the memory chip of claim 1, wherein the method for measuring the thickness of the ONO layer in the memory chip comprises using a sense amplifier to electrically measure the thickness of the ONO layer.

7. The method for dynamically adjusting the operation of the memory chip of claim 1, wherein the thickness of the ONO layer is measured when a wafer sort is being processed.

8. The method for dynamically adjusting the operation of the memory chip of claim 1, wherein the thickness of the ONO layer is measured when a final test is being processed.

9. The method for dynamically adjusting the operation of the memory chip of claim 1, wherein the memory chip comprises a flash memory chip.

* * * * *